US 9,303,839 B2

(12) United States Patent
Scagliarini

(10) Patent No.: US 9,303,839 B2
(45) Date of Patent: Apr. 5, 2016

(54) VENTILATION ELEMENT FOR A HOUSING CONTAINING AN ELECTRICAL, MECHANICAL OR ELECTROMECHANICAL MEMBER

(71) Applicant: GVS S.P.A., Zola Predosa (IT)

(72) Inventor: Marco Scagliarini, Bologna (IT)

(73) Assignee: GVS S.P.A., Zola Predosa (Bologna) (IT)

( * ) Notice: Subject to any disclaimer, the term of this patent is extended or adjusted under 35 U.S.C. 154(b) by 0 days.

(21) Appl. No.: 14/395,013

(22) PCT Filed: Apr. 4, 2013

(86) PCT No.: PCT/IB2013/052680
§ 371 (c)(1),
(2) Date: Oct. 16, 2014

(87) PCT Pub. No.: WO2013/156887
PCT Pub. Date: Oct. 24, 2013

(65) Prior Publication Data
US 2015/0062940 A1 Mar. 5, 2015

(30) Foreign Application Priority Data

Apr. 19, 2012 (IT) .............................. MI2012A0654

(51) Int. Cl.
*B60Q 1/00* (2006.01)
*B60Q 1/26* (2006.01)
(Continued)

(52) U.S. Cl.
CPC .............. *F21S 48/335* (2013.01); *F16H 57/027* (2013.01); *F21S 48/332* (2013.01); *F21V 31/03* (2013.01); *F28D 15/00* (2013.01); *H05K 5/0213* (2013.01)

(58) Field of Classification Search
CPC ...... F21S 48/332; F21S 48/335; F21V 31/03; F28D 15/00; F16H 57/027; B01D 53/22; B01D 2053/221; B01D 2279/35
USPC ......... 362/487, 470, 546, 547, 362, 458, 457; 55/385.4; 63/8, 87; 96/4
See application file for complete search history.

(56) References Cited

U.S. PATENT DOCUMENTS 5,509,949 A * 4/1996 Gluys ................... F16H 57/027
                                                          55/385.3
5,914,415 A * 6/1999 Tago .................. B01D 19/0031
                                                          55/385.1
(Continued)

FOREIGN PATENT DOCUMENTS

DE     102006062044 A1    4/2008
DE     102010025979 A1    1/2012
(Continued)

OTHER PUBLICATIONS
English Language Translation of JP2009129557A Jun. 2009.*
(Continued)

*Primary Examiner* — Bao Q Truong
*Assistant Examiner* — Glenn Zimmerman
(74) *Attorney, Agent, or Firm* — Vorys, Sater, Seymour and Pease LLP

(57) ABSTRACT

An element for ventilating a housing containing an electrical, mechanical, electromechanical or similar member includes a rigid body having an outer cylindrical wall, closed at a first end by a closure part, the cylindrical wall being open at a second end coupled to the housing, the body containing an internal member of at least partly yieldable material having a first end close to the closure part of the rigid body and carrying a filtering membrane, and an open second end facing the housing. From the closure part an internal cylindrical portion projects containing the member and couples to this latter by interference so as to retain it within the body.

9 Claims, 4 Drawing Sheets

(51) Int. Cl.
*F21S 8/10* (2006.01)
*F21V 31/03* (2006.01)
*F16H 57/027* (2012.01)
*H05K 5/02* (2006.01)
*F28D 15/00* (2006.01)

(56) References Cited

U.S. PATENT DOCUMENTS

| | | | | |
|---|---|---|---|---|
| 6,364,924 | B1* | 4/2002 | Mashiko | F21S 48/335 55/385.1 |
| 6,524,361 | B1* | 2/2003 | Thornton | B01D 19/0031 55/385.1 |
| 2009/0084078 | A1* | 4/2009 | Furuyama | F21S 48/335 55/385.4 |
| 2009/0266815 | A1 | 10/2009 | Lauk et al. | |
| 2011/0275305 | A1 | 11/2011 | Egersdoerfer et al. | |
| 2013/0139484 | A1 | 6/2013 | Furuyama et al. | |

FOREIGN PATENT DOCUMENTS

| | | | |
|---|---|---|---|
| EP | 1102002 | A2 | 5/2001 |
| EP | 1939523 | A1 | 7/2008 |
| JP | 2009129557 | A * | 6/2009 |
| WO | 2010076326 | A1 | 7/2010 |

OTHER PUBLICATIONS

International Search Report and Written Opinion mailed Aug. 27, 2013 for PCT/IB2013/052680 to GVS S.P.A. filed Apr. 4, 2013.

* cited by examiner

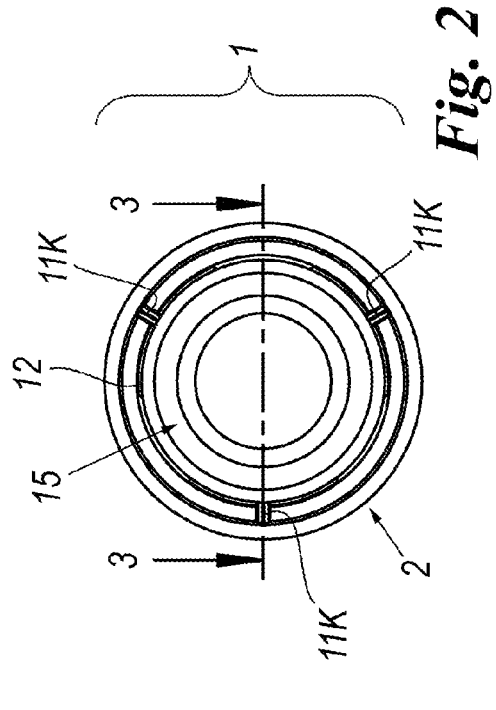
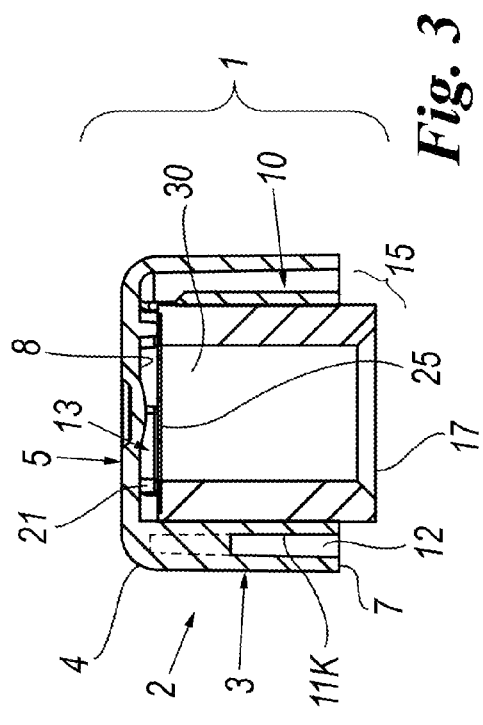
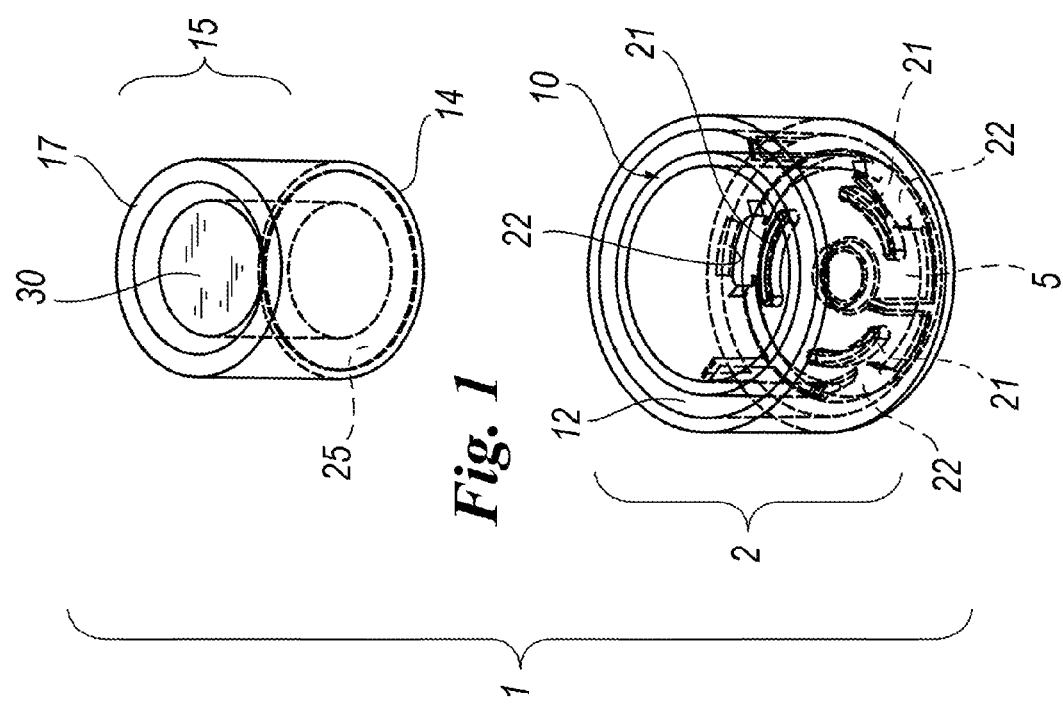

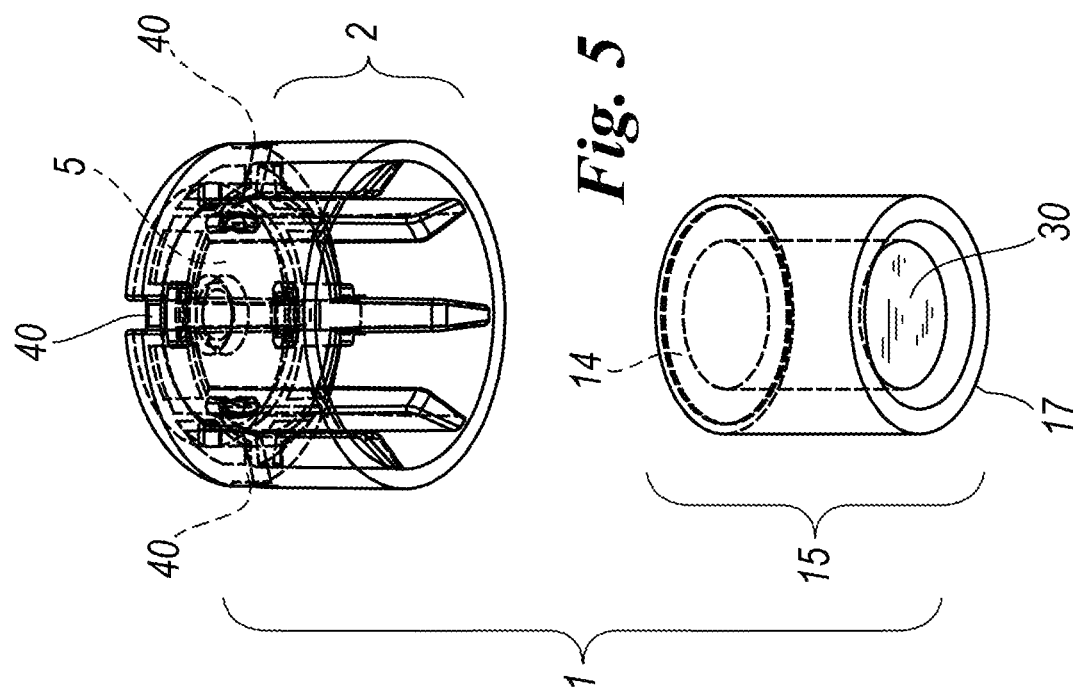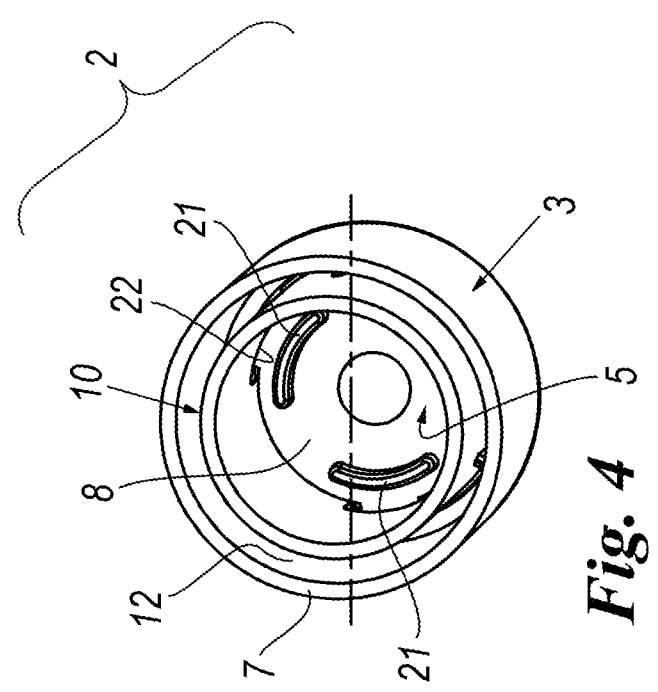

VENTILATION ELEMENT FOR A HOUSING CONTAINING AN ELECTRICAL, MECHANICAL OR ELECTROMECHANICAL MEMBER

CROSS-REFERENCE TO RELATED APPLICATIONS

This is a §371 National Stage Application of International Application No. PCT/IB2013/052680 filed on 4 Apr. 2013, claiming the priority of Italian Patent Application No. MI2012A000654 filed on 19 Apr. 2012.

FIELD OF THE INVENTION

The present invention relates to a ventilation element for a housing containing an electrical, mechanical, electromechanical or similar member in accordance with the introduction to the main claim.

BACKGROUND OF THE INVENTION

The use of elements for ventilating known housings in the automobile industry or of vehicles in general is known to be widespread; these ventilation elements for example are associated with apertures in containers of electrical or electronic parts (such as the optical units or headlamps of motor vehicles) or of mechanical parts (gearboxes, hydraulic transmission members, window opening systems or windscreen wiper units, for example) where the pressure must be equalized between the interior of these containers and the external environment. An element of the aforesaid type is usable in every component, not necessarily in the automobile industry, where said need for pressure compensation/equalization exists (for example electrical control panels, street lighting systems, chemical product containers or cans).

These ventilation elements are also known to have a form such as to limit water entry into said containers or housings, such water deriving from rain or puddles or from vehicle or engine washing. For example a ventilation element is known from EP1102002 comprising a cylindrical cover member closed at one end and open at the opposite end in which a substantially cylindrical body is inserted. An air passage is formed between the inner wall of said member and the outer wall of the internal body and between the lower surface of the member and the lower end of said body. A plurality of projections are positioned at predetermined intervals along the periphery of the internal body; when said body is not coupled to the cover member, its outer diameter (including the projections) is greater than that of the member, whereas when the body is inserted into the member, its projections enter into contact with the inner wall of said member so that the body becomes positioned and fixed in this latter to create the air passage between the projections.

A hydrophobic membrane can be associated with the internal body at that end of this latter internal to said cover member.

In the aforesaid known solution, the ventilation function of the subject element of the patent and the connection function between the cover member and the internal body are both achieved by the internal body projections which maintain it spaced from the wall of the cover member. This involves the need for careful specific design of the internal body to ensure suitable ventilation of the housing.

Moreover, as the internal body is yieldable, it can deform on insertion or with the passage of time ("relaxing") to hence modify the cross-sections of the air passages, and thus modify the ventilation of the housing with which the ventilation element is associated.

In addition, the internal body can enter into contact with foreign elements which penetrate from the open end of the protection member, hence undergoing damage.

Furthermore, in the known solution, the internal body, of yieldable material, projects from the cover member and is connected to the housing. This requires careful design of the ventilation element to obtain correct shaping of said body and member such as to achieve a correct and reliable sealed connection to the relative housing. In addition, after coupling the body of yieldable material to the housing it is difficult to separate it from this latter when the ventilation element needs to be removed.

Moreover, the aforesaid known solution (and other known equivalents in the technical field) presents a large rubber portion (internal body), involving a considerable cost for the finished product, and lengthy production times related to the moulding of the internal body.

SUMMARY OF THE INVENTION

An object of the present invention is to provide a ventilation element for a housing containing electrical equipment, such as a housing used in the automobile field as an optical unit (or lighting system in general) or a container for a vehicle electrical control circuit, or other housing of the aforesaid type, which represents an improvement over similar already known elements.

A particular object of the invention is to provide a ventilation element of the stated type which can be produced relatively quickly at low cost compared with similar known ventilation elements.

Another object is to provide a ventilation element of the stated type which offers optimal ventilation of the housing with which it is associated in any condition in which this latter is used and which maintains this ventilation optimal with time.

A particular object is to provide a ventilation element of the stated type in which the ventilation air flow can be optimized by suitably dimensioning its parts and in which the ventilation function can be separated from the "mechanical" function of these parts.

Another object is to provide a ventilation element of the stated type the shape of which is stable with time.

These and other objects which will be apparent to the expert of the art are attained by a ventilation element in accordance with the accompanying claims.

BRIEF DESCRIPTION OF THE DRAWING

The present invention will be better understood from the accompanying drawings, which are provided by way of non-limiting example and in which:

FIG. 1 is an exploded view of a first embodiment of a ventilation element according to the invention;

FIG. 2 is a view of the element of FIG. 1 from above;

FIG. 3 is a section on the line 3-3 of FIG. 2;

FIG. 4 is a perspective view of a component of the element of FIG. 1;

FIG. 5 is an exploded view of a second embodiment of a ventilation element according to the invention;

DETAILED DESCRIPTION OF THE PREFERRED EMBODIMENTS

Figure 8:
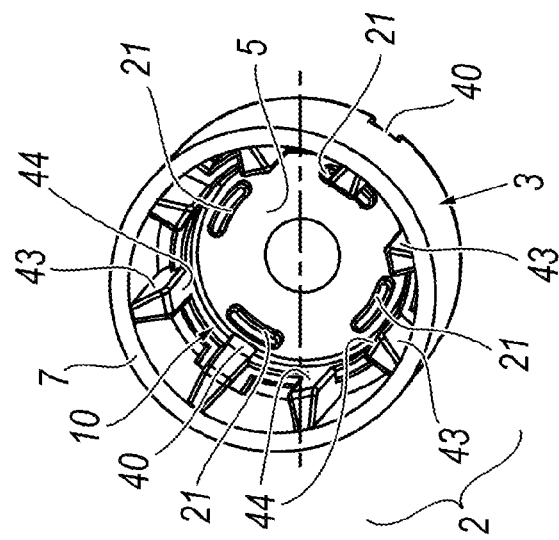
FIG. 8 is a perspective view of a component of the element of FIG. 5.
Figure 6:
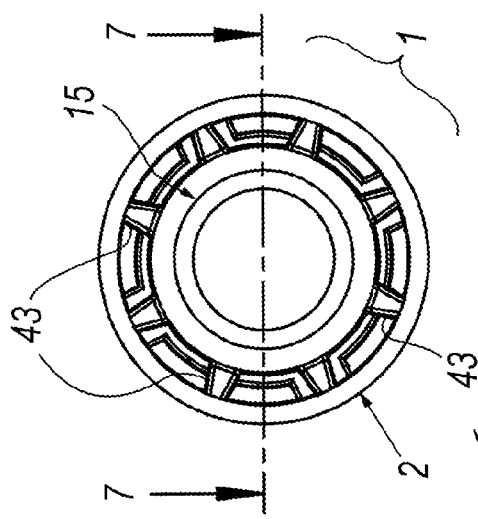
FIG. 6 is a view of the element of FIG. 5 from above.
Figure 7:
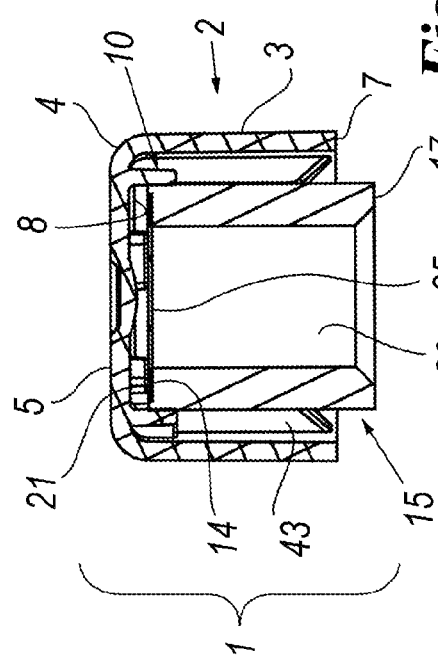
FIG. 7 is a section on the line 7-7 of FIG. 6.

With reference to FIGS. 1-4, these show a ventilation element 1 comprising a rigid body 2, made of plastic or sintered material and having a cylindrical part 3 closed at a first end 4 by a closure part 5 and open at a second end 7. The part 5 is preferably integral with the cylindrical part 3.

An internal cylindrical portion 10 projects from an inner side 8 (with respect to the body 2) of said part 5, with which it is integral, and extends as far as the second end 7 of the body 2. This internal portion 10 hence forms a part of the body 2, i.e. is in one piece with it.

The internal portion 10 is coaxial with the cylindrical part or outer wall 3 of the body 2, between these there being a recess or interspace 12. The portion 10 and said wall 3 are connected together by ribs 11 K which stiffen the body 2 and prevent its deformation with time due to thermal cycles, vibrations or atmospheric agents.

As will be described, this recess 12 of the body 2 is in communication with a compartment 13 present between the closure part 5 and a first end 14 of a cylindrical member 15 inserted coaxially into the internal cylindrical portion 10 of the body 2 and retained within this latter by interference with said portion. Said member 15 is of yieldable material, such as natural or synthetic rubber or equivalent material, and comprises a second end 17 projecting from the body 2.

The first end 14 of the member 15 is located in a position corresponding with but spaced from the closure part 5 of the body 2, the aforesaid compartment 13 hence being formed between this part and said end. To ensure the spaced positioning of the member 15 from said closure part 5, shoulders 21 project from the inner side 8 of this latter, on which the first end 14 of the member 15 rests. The shoulders 21 are of arched shape and contact the member 15 on the inside of the cylindrical portion 10 of the body 2.

As stated, the interspace or recess 12 communicates with the compartment 13 via slots 22 provided in said portion 10, advantageously to the front of the shoulders 21. These slots, preferably having sharp edges, cooperate with the cylindrical member 15 and contribute to maintaining this member coupled to the portion 10. This takes place in particular by virtue of the further deformation of the member 15 when connected to the housing on which the element 1 is mounted. This connection is achieved by mounting the member 15 on a male element of said housing; this causes said deformation which, added to the thrust which the member 15 generates on the portion 10 on mounting the element 1, causes said member to cooperate in strict adherence with the slots 22 to hence lock it within the rigid body 2.

This fact means that on separating the element 1 from said housing, the member 15 becomes reliably detached from this latter as it forms essentially one piece with the rigid body 2.

Figure 9:
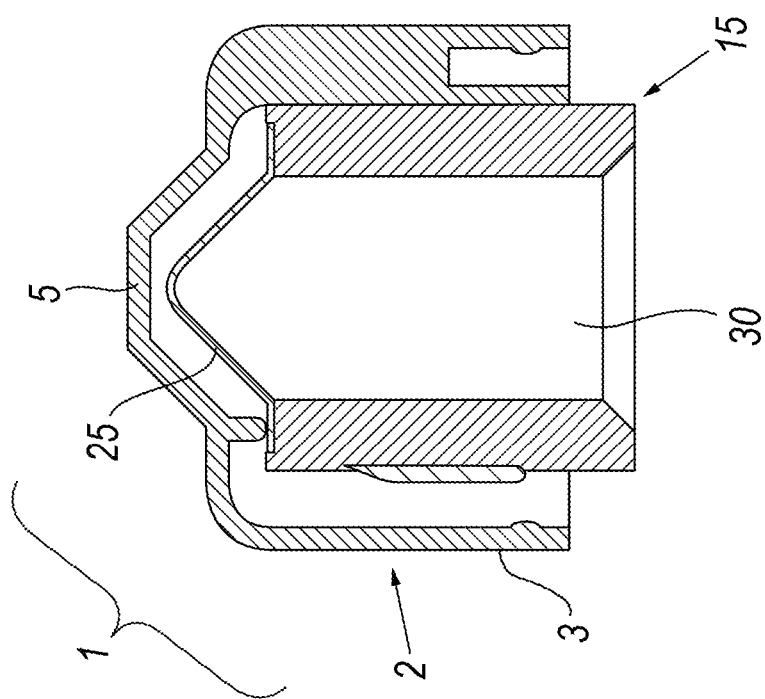
FIG. 9 is a section through a variant of the invention.

At the first end 14, the member 15 supports a membrane of known hydrophobic material 25, while at the second end 17 of this member the element 1 is coupled to the housing which is to be ventilated. The membrane 25 can be flat or have a different shape, with its surface continuous or presenting a succession of crests and depressions, for example as a concave surface (for example conical with its vertex facing the side 8) or convex. As visible in FIG. 9, a variant of the invention is shown presenting a conical membrane 25. In this variant, the closure part 5 can be flat as in the previous figures or have a shape which follows the membrane profile as shown in FIG. 9.

For ventilation, the air of the housing with which the element 1 is associated passes through the conduit 30 of the tubular member 15, passes through the membrane 25 and from there into the compartment 13. The air passes through the slot 22 into the interspace 12 and emerges from the body 2 through its second end 7. By virtue of he fact that the recess or interspace 12 is defined by two rigid parts (the wall 3 and the portion 10), it is non-deformable and ensures constancy in the ventilation air flow. This enables the ventilation air flow rate to be optimized by suitable dimensioning of the interspace 12 of the body 2 and of the slots 22, said flow rate hence not depending on components of variable dimensions as for example is the case of known solutions in which ventilation takes place between a rigid and a yieldable body, for example of rubber. In the case of the present invention, as the flow always takes place between rigid parts (the wall 3 and the portion 10), it can be calculated precisely and be guaranteed by suitable design of the rigid body 2.

In addition, this ventilation is achieved precisely and only via the body 2, the member 15 being used only for supporting the membrane 25 and for securing the element 1 to the housing to be ventilated. The member 15 supporting the membrane 25 is moreover well protected by the body 2 and by its two coaxial parts, the wall 3 and the portion 10. This protection is to be considered valid both against impacts to which the member 15 could be subjected and against external agents, such as variation in the temperature of the air surrounding the element 1, which could worsen the performance of said element with time by limiting its deformation or "relaxation".

In addition, the element 1 makes little use of components of yieldable material, which have a cost exceeding that of rigid components, for example of plastic. The cost is hence lower than known solutions with lesser production times than these latter.

Moreover, the shape of the body 2 with the cylindrical portion 10 and of the member 15, also cylindrical, facilitates their manipulation during assembly of the element 1, achieved by automatic machines. This is because of the simplicity of the geometrical shape of said body 2 and member 15 which are easy to handle and couple together.

Finally, the member 25 is inserted into the portion 10 and contacts the entire surface of this latter. This maximizes the seal of the assembly with time, without projections or other coupling members being required on at least one from said portion and said member.

In FIGS. 5-8, in which parts corresponding to those of the already described figures are indicated by the same reference numerals, the element 1 comprises apertures 40 provided in proximity to or at the closure part 5 of the body 2.

These apertures 40 are through apertures and communicate with the compartment 13; within this latter the shoulders 21 on which the member 15 rests are present in front of said apertures. The function of these shoulders, as also in the embodiment of FIGS. 1-4 (but with greater emphasis in the embodiment under examination), is to disperse into the compartment 13 any water droplets which pass through the apertures 40 (or the slots 22 of the previously described embodiment) and prevent their impact against the membrane 25 associated with the member 15 in proximity to the closure part 5.

The cylindrical portion 10 projects from said part 5 but, in contrast to the embodiment of FIGS. 1-4, does not extend as far as the second end 7 of the body 2, but terminates within this latter. The extension of said portion 10, however, is such that it couples by interference to the member 15 to hence retain it secured to the body 2. To improve this retention, shoulders or uprights 43 extend from the portion 10 in one piece with this portion and with the wall 3 of the body 2, having a free wall 44 cooperating by interference with the member 15 and contributing to retaining this latter in the body 2.

In the embodiment of FIGS. 5-8, the ventilation of the housing to which the element 1 is connected takes place by a flow which passes through the member 15, through the compartment 13 and emerges from the body 2 through the apertures 40.

The aforedescribed solution also presents at least part of the advantages already indicated with reference to the embodiment of FIGS. 1-4.

Various embodiments of the invention have been described. Others are however available in the light of the aforegoing description and are to be considered as falling within the scope of the following claims.

The invention claimed is:

1. An element for ventilating a housing containing an electrical, mechanical, or electromechanical member, or a housing for electrical members or components, said element comprising a rigid body having an outer cylindrical wall, closed at a first end by a closure part, said cylindrical wall being open at a second end coupled to the housing, said body containing an internal member of at least partly yieldable material having a first end close to the closure part of the rigid body and carrying a filtering membrane, and an open second end facing said housing, wherein from said closure part an internal cylindrical portion projects containing said member and couples to this member by interference to retain this member within the body, wherein the cylindrical portion extends parallel to the cylindrical wall as far as the second end of the rigid body, wherein between the cylindrical portion and the cylindrical wall an interspace is present connected to a compartment interposed between the first end of the yieldable member and the closure part of the rigid body, said connection being obtained by slots made in said cylindrical portion in proximity to said closure part, said slots cooperating with the internal member and contributing to its fixing to the rigid body.

2. The element as claimed in claim 1, wherein said cylindrical portion extends within the rigid body, but terminates before the second end of said body.

3. The element as claimed in claim 1, wherein in proximity to, or at, the closure part, the rigid body comprises at least one aperture communicating with a compartment present between said part and the first end of the internal member.

4. The element as claimed in claim 1, comprising, at each slot, a shoulder rising from the closure part within the rigid body.

5. The element as claimed in claim 1, wherein said rigid body is in one piece and comprises, without interruption of continuity, the outer cylindrical wall, the closure part and the cylindrical portion, said body being of plastic or sintered material, the interspace between said wall and said cylindrical portion hence being non-deformable and enabling constancy of ventilation air flow with time.

6. The element as claimed in claim 1, wherein said internal member is of natural or synthetic rubber, or equivalent yieldable material.

7. The element as claimed in claim 1, wherein the filtering membrane has a flat or concave or convex shape, the surface of the filtering membrane being either flat or presenting a succession of crests and depressions.

8. The element as claimed in claim 1, wherein the electrical, mechanical, or electromechanical member is an automobile headlamp.

9. The element as claimed in claim 2, wherein shoulders or uprights rigid with the cylindrical wall extend from said cylindrical portion and cooperate with said internal member.

* * * * *